United States Patent [19]

Ozturk et al.

[11] Patent Number: 5,101,247
[45] Date of Patent: Mar. 31, 1992

[54] GERMANIUM SILICON DIOXIDE GATE MOSFET

[75] Inventors: Mehmet Ozturk, Cary; Jimmie Wortman, Chapel Hill, both of N.C.

[73] Assignee: North Carolina State University, Raleigh, N.C.

[21] Appl. No.: 515,595

[22] Filed: Apr. 27, 1990

[51] Int. Cl.$^5$ .................. H01L 29/10; H01L 29/78
[52] U.S. Cl. .................. 357/23.4; 357/23.1; 357/59
[58] Field of Search .............. 357/23.15, 23.9, 61, 357/23.1, 59 G J

[56] References Cited

U.S. PATENT DOCUMENTS

| | | | |
|---|---|---|---|
| 3,505,107 | 4/1970 | Gleim | 117/212 |
| 3,967,981 | 7/1976 | Yamazaki | 357/23.9 |
| 4,005,240 | 1/1977 | Schlacter | 428/333 |
| 4,357,179 | 11/1982 | Adams et al. | 148/1.5 |
| 4,435,445 | 3/1984 | Allred et al. | 427/54.1 |
| 4,605,947 | 8/1986 | Price et al. | 357/23.15 |
| 4,637,895 | 1/1987 | Ovshinsky et al. | 252/188.31 |
| 4,696,758 | 9/1987 | Ovshinsky et al. | 252/188.31 |
| 4,698,234 | 10/1987 | Ovshinsky et al. | 427/39 |
| 4,766,008 | 8/1988 | Kodato | 427/39 |

OTHER PUBLICATIONS

Selective Ge deposition on Si using thermal decomposition of GeH$_4$; Hiromu Ishii, Yasuo Takahashi, and Junichi Murota; Appl. Phys. Lett. 47(8), Oct. 15, 1985.
Selective Epitaxy Using Silane and Germane; D. J. Dumin; RCA Laboratories, Princeton, NJ 08540, U.S.A.; Journal of Crystal Growth 8(1971) 33-36, North-Holland Publishing Co.
Nucleation and growth of chemically vapor deposited tungsten on various substrate materials: A review; Eliot K. Broadbent, Philips Research Lab Sunnyvale, Sig. Corp.; J. Vac. Sci. Tech. B5(6) Nov./Dec. 1987.
Low-temperature annealing of As-implanted Ge; S. V. Hattangady and G. G. Fountain, Res. Triangle Inst.; E. H. Nicollian, Uni. of N.C.; R. H. Markunas, Res. Triangle Inst.; J. Appl. Phys. 63(1), Jan. 1, 1988.
Metal-oxide-semiconductor field-effect transistors fabricated using self-aligned silicide technology; B-Y. Tsaur and C. H. Anderson, Jr., Lincoln Lab. MIT; Appl. Phys. Lett. 47(5) Sep. 1, 1985.
Radiation-Enhanced Diffusion of Boron in Germanium During Ion Implantation; M. I. Guseva and A. N. Mansurova, Durchatov Atomic Energy Inst., Moscow; Radiation Effects 1973, vol. 20, pp. 207-210.

Primary Examiner—Andrew J. James
Assistant Examiner—Daniel N. Russell
Attorney, Agent, or Firm—Bell, Seltzer, Park & Gibson

[57] ABSTRACT

The invention is a method of depositing a layer of polycrystalline silicon on a silicon dioxide substrate until the layer of polycrystalline silicon is thick enough to support the deposition of germanium thereon, but while thin enough to substantially avoid the deleterious effects on the characteristics of semiconductor device structure that the deposition of polycrystalline silicon would otherwise potentially cause. The polycrystalline layer is then exposed to a germanium containing gas at a temperature below the temperature at which germanium will deposit on silicon dioxide alone while preventing native growth of silicon dioxide on the polycrystalline silicon layer, and for a time sufficient for a desired thickness of polycrystalline germanium to be deposited on the layer of polycrystalline silicon.

10 Claims, 1 Drawing Sheet

GERMANIUM SILICON DIOXIDE GATE MOSFET

FIELD OF THE INVENTION

The present invention relates to the manufacture of semiconductor devices, and in particular relates to an advantageous technique for producing such devices using germanium thin films deposited upon silicon dioxide. This application is related to Ozturk et al, Ser. No. 515,589; filed concurrently herewith for "Self-Aligned Chemical Vapor Deposition of Germanium Thin Films and Resulting Products."

BACKGROUND OF THE INVENTION

In the manufacture of integrated circuits, and particularly in single wafer manufacturing, one of the most important practical technique considerations is the throughput; i.e. the speed with which devices can be manufactured, or considered from another standpoint, the number of devices that can be produced in a given amount of time. Processes that require long processing times are less practical from a manufacturing standpoint and processes or techniques which reduce process times while retaining or increasing the quality of resulting devices are almost always advantageous.

In the single wafer processes for which throughput is important, one of the most common thin films used in integrated circuit manufacture is polycrystalline silicon, often referred to as "polysilicon" or "poly-Si." For example, in metal-oxide-semiconductor (MOS) integrated circuit technology, polysilicon doped to be sufficiently conductive is typically used as the gate electrode and as an interconnect material on silicon dioxide. It thus offers a wide range of practical applications for which it has been found most useful.

Nevertheless, there are disadvantages to the use of polysilicon in single wafer manufacturing, the most glaring of which is the relatively low deposition rate of silicon at the temperatures at which the best material properties are obtained. Typically, this means that the deposition of polysilicon requires a high "thermal budget," a term used to describe the combined product of time and temperature required to carry out any particular process. For example, polysilicon typically must be deposited at temperatures greater than about 550° C. (usually about 575° to 650° C.) in order to exhibit acceptable deposition rates. Even so, these deposition rates are very slow, and can only be increased by raising the deposition temperature. The use of higher temperatures, however, causes other problems in the manufacturing process. In some instances exposure to higher temperatures requires that other materials in the integrated circuit that are sensitive to such temperatures be protected or eliminated from the effects of such a heating step. As another illustration, dopants present in the semiconductor material will exhibit an increased tendency to diffuse or migrate as higher temperatures are used, thereby destroying the p-n junction characteristics which make the device operable in the first place. Furthermore, a number of metals cannot be present during a processing step as they would melt and reflow at such temperatures.

Other disadvantages of the silicon processes include the typical characteristic that in a single wafer processor using an optical heating process ("optical furnace") and the appropriate quartz windows, polysilicon will deposit on these hot windows as well as on the wafers in the optical furnace. The windows then become heated and in turn block the optical heating of the wafers, thus causing additional secondary problems in the overall deposition process. For example, temperature measurement using optical pyrometers tend to become erroneous under such circumstances.

Another disadvantage of polysilicon is that a preferred manufacturing process uses low pressure chemical vapor deposition (CVD) which slows the deposition of polysilicon even further. As is known to those familiar with this technology, CVD can take place under various conditions of temperature and pressure. At higher pressures, however, the silicon carrying gas (usually silane, $SiH_4$) tends to deplete from wafer to wafer in the commonly used multi-wafer techniques. Atmospheric pressure CVD, or other higher pressure CVD processes, also tend to produce wafers which exhibit the depletion of silane even across single wafers. In single wafers, the depletion effect is referred to as a "bulls eye" problem. Low pressure CVD tends to minimize or eliminate these problems, but slows the deposition rate as just described.

All of these disadvantages, among others, provide difficulty in the use of polysilicon in certain device manufacturing techniques with accompanying compromises in device design or manufacturing through-put.

One potential alternative to the use of polysilicon, particularly in MOS devices, is the use of germanium (Ge) as a substitute for silicon in certain applications. Germanium has electrical properties generally similar to silicon and offers several theoretical advantages as well, particularly when analyzed in terms of a thermal budget. For example, when using low pressure CVD, germanium can be deposited at temperatures as low as 350° C. at considerably higher deposition rates than can silicon at much higher temperatures. Thus, a layer of polycrystalline germanium of a given thickness can be deposited more quickly and at a lower temperature than can an equivalently thick layer of polysilicon. The lower thermal budget for germanium provides resulting advantages for through-put in device manufacturing processes.

Using present technology, it is recognized that thin films of germanium can be selectively deposited on silicon using low temperature chemical vapor deposition of germane ($GeH_4$) as the reactive gas. Under typical low pressure CVD conditions, however, germanium will not deposit on silicon dioxide ($SiO_2$) which is typically used as a localization barrier in the manufacture of integrated circuit devices and therefore often adjoins a silicon surface. The tendency of germanium to refrain from depositing on silicon dioxide is apparently due to the low density of germanium absorption sites available on $SiO_2$. Additionally, it may be possible that this characteristic results from a $GeH_4$ etching of the $SiO_2$ surface that produces volatile GeO.

As a result, to date the use of germanium in certain kinds of structures has been limited by the characteristic that germanium will not deposit on silicon dioxide in the otherwise convenient processes of chemical vapor deposition using germane gas. Thus, in metal-oxide-semiconductor (MOS) structures such as depletion and inversion mode MOSFETs or MOS capacitors, the gate electrode material has been limited to polysilicon or some other material rather than the thermally advantageous polycrystalline germanium material.

The need therefore exists for a method of advantageously using the properties of polycrystalline germanium, particularly the low thermal budget with which it can be worked, in combination with MOS-type structures.

OBJECT AND SUMMARY OF THE INVENTION

It is therefore an object of the present invention to provide a method of using germanium thin films in combination with silicon dioxide in the fabrication of metal-oxide-semiconductor (MOS) structures.

The invention comprises the method of depositing a layer of polycrystalline silicon on a silicon dioxide substrate until the layer of polycrystalline silicon is thick enough to support the deposition of germanium thereon, but while thin enough to be deposited sufficiently rapidly to substantially avoid the deleterious effects on the characteristics of the structure that the deposition of polycrystalline silicon would otherwise require, and then exposing the polycrystalline layer to a germanium containing gas at a temperature below the temperature at which germanium will deposit on silicon dioxide while preventing native growth of silicon dioxide on the polycrystalline silicon layer, and for a time sufficient for a desired thickness of polycrystalline germanium to be deposited on the layer of polycrystalline silicon.

The foregoing and other objects, advantages and features of the invention, and the manner in which the same are accomplished, will become more readily apparent upon consideration of the following detailed description of the invention taken in conjunction with the accompanying drawing, which illustrates preferred and exemplary embodiments, and wherein:

DETAILED DESCRIPTION OF THE PREFERRED EMBODIMENTS

Figure 1:
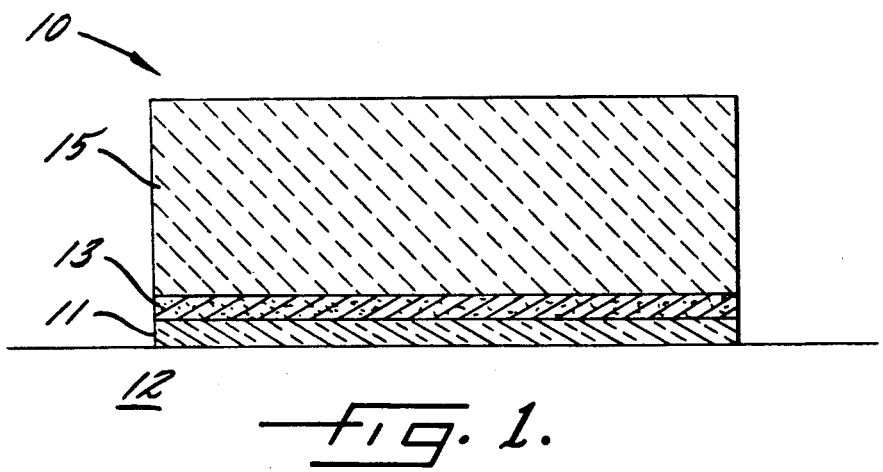
FIG. 1 is a schematic diagram showing a polycrystalline germanium layer deposited on a polysilicon layer on a silicon dioxide surface.

The invention is a method and resulting device structure of depositing germanium thin films on silicon dioxide that is particularly advantageous in the fabrication of self-aligned metal-oxide-semiconductor structures. The method comprises depositing a layer of polycrystalline silicon on a silicon dioxide substrate until the layer of polycrystalline is thick enough to support the deposition of germanium thereon while thin enough to be deposited sufficiently rapidly to substantially avoid deleterious effects on the characteristics of the oxide structure during the deposition process. In a preferred embodiment, the step of depositing the layer of polycrystalline silicon comprises exposing the silicon dioxide substrate to silane gas that has been pyrolyzed into a vapor that includes silicon atoms. This step can be performed by exposing the silicon dioxide substrate to silane gas, rapidly heating the substrate to a temperature at which the silane gas pyrolyzes into silicon atoms that will deposit upon the silicon dioxide surface, and them rapidly stopping the heating of the substrate when the layer of polycrystalline silicon is thick enough to support the deposition of germanium thereon, but before the heating process otherwise affects the oxide structure.

The method then comprises exposing the polycrystalline silicon layer to a germanium-containing gas a temperature below that at which germanium will deposit on silicon dioxide alone while preventing native growth of silicon dioxide on the polycrystalline silicon layer and for a time sufficient for a desired thickness of polycrystalline germanium to be deposited upon the layer of polycrystalline silicon. As used herein "germanium-containing gas" refers to a gas that will provide germanium atoms for deposition on a surface under CVD conditions. Preferably, the germanium-containing gas comprises germane. As also used herein, the phrase "silicon dioxide alone" refers to the characteristic that germanium will not deposit on $SiO_2$ absent the techniques of the present invention.

In the preferred embodiment, the step of exposing the polycrystalline silicon layer to the germanium gas comprises exposing the polycrystalline silicon layer to germane gas that has been pyrolyzed (i.e. thermal decomposition) into a vapor that includes germanium atoms. In a manner similar to the heating of the silane gas, this method can further comprise exposing the substrate to germane gas at a moderate temperature, rapidly heating the substrate to a temperature at which the germane gas pyrolyzes into germanium atoms that will deposit upon the surface of the polycrystalline silicon layer, and then rapidly stopping the heating of the substrate when the desired amount of germanium has been deposited upon the polycrystalline layer.

The invention further comprises a new method of taking advantage of certain equipment that is otherwise known in the art, even if somewhat sophisticated. As set forth earlier, in preferred embodiments the rapid heating can be done in a rapid thermal oven or "cold wall" system which is typically optically heated. Such an oven typically includes windows through which infrared radiation can be directed which will heat the substance of interest very quickly as a result of the interaction of the infrared radiation with the material. This is in contrast to more conventional ovens which operate by convection or conduction heating or both. It will be understood that although the use of a rapid thermal oven and optical heating techniques are preferred, the invention is not limited to such techniques. Thus, the method of the invention can also be carried out in a conventional low temperature CVD furnace which is often referred to as a "hot wall" system. It should be further understood, however, that depositing very thin layers of polysilicon is very difficult to accomplish in such hot wall systems. In typical rapid thermal techniques (also referred to as "rapid thermal annealing" or "RTA"), the heating device or oven in which the process takes place is a water cooled stainless steel chamber or reaction vessel with one or more quartz windows through which infrared radiation can be directed. The reaction vessel may be entirely formed of quartz or any other otherwise suitable material, or combination of materials, that provide for the transmission of infrared radiation. This radiation heats the silicon substrate (and its associated $SiO_2$ portions) very rapidly so that the thermal decomposition of the appropriate gas takes place when the gas interacts with the wafer. The process can thus be temperature controlled rather than gas flow controlled and this in turn permits the desired accuracy and precision needed to deposit the extremely thin polysilicon layer (as thin as 5 nanometers or less) and then the germanium.

In an overall view of the process, a flow of silane gas is introduced into an evacuated reaction vessel which contains the semiconductor substrate for which at least a portion of the surface comprises a layer of silicon dioxide. As used herein, the term of "rapidly heating" refers to the fast "ramp up" and "ramp down" times which are characteristic of rapid thermal ovens. Typically, rapid thermal processing can change the temperature of the substrate (and in turn the respective silane and germane gases that interact with the substrate) at a rate of 100° C. per second or greater. Using this preferred technique, the thickness of the layer of polysilicon which is deposited on the oxide can be controlled rather accurately, and in particular can be maintained extremely thin; on the order of 5 to 10 nanometers (nm) or less. Although the inventors do not wish to be bound by any particular theory of the invention, it appears that the polysilicon layer supplies the necessary absorption sites for germanium deposition.

Thus, the thickness of polysilicon required according to the invention can be expressed simply as an amount thick enough to support the deposition of germanium thereon under the appropriate conditions of temperature and pressure. Following the deposition of the polysilicon layer, and without breaking the vacuum in the reaction vessel, the source gas for the germanium is introduced and the substrate again heated. As stated earlier, both the silane and the germane gas are typically pyrolyzed during rapid thermal processing so that the free silicon atoms or germanium atoms respectively can in turn become deposited upon the surface. Thus, in a preferred embodiment the step of introducing germane gas into the reaction vessel comprises replacing the flow of silane gas with a flow of germane gas. The in-situ nature of the process of the invention prevents native oxide growth as well as the introduction of undesirable contaminants into the reaction vessel.

As part of the low pressure CVD system, the germane and silane respectively are introduced at low pressure in a carrier gas which typically comprises hydrogen or argon. In a preferred embodiment, the step of introducing the flow of silane gas comprises introducing a flow of silane gas having a pressure of about 10 torr or less. In turn, the step of maintaining the heating of the substrate and silane gas adjacent to the substrate until a desired layer of polycrystalline silicon is deposited upon the silicon dioxide surface comprises maintaining the heating until the layer of polycrystalline silicon is no more than about 10 nm thick, and preferably 5 nm thick or less. Following the silane, the germane gas is introduced at a pressure of about 10 torr and with the germane comprising between about one and eight percent of the total gas flow. There is no function limitation of the percent of germane in the gas flow, i.e. a 100% germane flow will work, but one percent is a convenient lower limit when using low total pressure, and eight percent is a convenient upper limit for safety purposes. Both silane and germane gases are relatively explosive (and germane is also very toxic) so that the low pressures combined with the carrier gas provides an extra measure of control and safety.

In this regard, it will be understood that the basic techniques for low pressure chemical vapor deposition are well known and thoroughly documented, and will not be specifically addressed herein other than as necessary to describe the invention.

One particular advantage is that the invention can be used in the same manner in which some other standard techniques can be used for making self-aligned MOSFETs, using the lower processing temperatures and shorter processing times made possible by the present invention. Using the invention, a MOSFET is formed by defining a gate oxide portion on a silicon substrate so that the oxide portion and remaining silicon portions are adjacent one another on the surface of the substrate. A layer of polycrystalline silicon is deposited on the gate oxide portion until the layer of polycrystalline silicon is thick enough to support the deposition of germanium thereon, while remaining thin enough to be deposited sufficiently rapidly to substantially avoid deleterious effects on the characteristics of the oxide structure during the deposition process. As stated earlier, avoiding the problems associated with the deposition of polysilicon is one of the main advantages of the present invention.

In a particular preferred embodiment, polysilicon deposition was carried out at 650° C. and at a total pressure of 10 Torr. A carrier gas of argon containing ten percent (10%) silane was used as the process gas.

The polycrystalline silicon layer is then exposed to a germanium containing gas at a temperature below that at which germanium will deposit on silicon dioxide alone, preferably no more than about 410° C., while preventing native growth of silicon dioxide on the polycrystalline silicon layer. The polycrystalline layer is further exposed to the germanium gas for a time sufficient for a layer of polycrystalline germanium to be deposited upon the layer of polycrystalline silicon that is thick enough to mask the oxide and the silicon substrate therebeneath from ion implantation or other doping techniques such as diffusion or gas immersion layer doping ("GILD"). Using the invention deposition of poly-Ge at rates as high as 80 nm (800 angstroms) per minute at temperatures below 450° C. have been observed.

Finally, in the preferred embodiment the substrate is implanted with dopant atoms using ion implantation so that the silicon substrate is doped immediately adjacent to the gate oxide, but not under the gate oxide because of the masking provided by the polycrystalline germanium. The result is a self-aligned source, gate and drain, with a gate contact formed of polycrystalline germanium, and which has been formed under conditions of temperature and thermal budget which are more advantageous than those under which similar structures using polysilicon can be formed.

As a further advantage of the invention, dopants introduced into poly-germanium to render it appropriately conductive can be activated more easily than those introduced into polysilicon. For example ion implanted boron (B) can be activated in poly-germanium at temperatures of about 400° C. and arsenic (As) at temperatures of about 650° C., both within time periods of about 10 seconds. In contrast, both of these dopants require anneals at or above 1000° C. in Rapid Thermal Annealers before they become activated in polysilicon. As is known to those familiar with semiconductor manufacturing techniques and the resulting devices, activating and controlling a dopant is a fundamental requirement for successful device manufacture. Therefore, the invention provides this additional advantage over the use of polysilicon.

In a particular preferred embodiment, a LEISK TM rapid thermal processor manufactured by Leisk Engineering Limited, Albert Drive, Burgess Hill, West Sussex, RH159NX, England was used. The system included a low-pressure, water-cooled, stainless steel process chamber with quartz windows. A low pressure was maintained by a mechanical pump that provided the base pressure of approximately 10 mTorr. A wafer to be processed was heated by two banks of quartz halogen lamps located on each side of the reaction tube with the upper bank oriented at 90° to the lower bank, thus providing intensity contouring in the x- and y-directions to reduce temperature gradients across the wafer. The wafer itself was held on a quartz holder suspended from the chamber door by a cantilever quartz system. The temperature was monitored by an optical pyrometer (wavelength of 3.5–4.1 μm) focused at the center of the wafer.

Certain of the structural features that can be produced using the present invention are illustrated in the drawings as example of the types of devices that can be produced using the invention.

FIG. 1 shows a gate structure broadly designated at 10 that is exemplary of the type used in a metal-oxide-semiconductor field effect transistor. The gate structure 10 comprises a gate oxide portion 11 on a semiconductor substrate 12 for which the gate oxide portion 11 defines a gate (i.e. an active region) in the semiconductor substrate. A thin film layer of polycrystalline silicon 13 covers the gate oxide portion 11 and is thick enough to support the deposition of germanium thereon. As stated earlier, an appropriate thickness is a thickness which will support the deposition of polycrystalline germanium, but which is thin enough to be deposited rapidly enough under conditions suitable for silicon deposition to avoid damage to the oxide structure from the deposition process. A germanium gate contact 15 formed of a germanium thin film is deposited upon the layer of polycrystalline silicon 13 and completes the structure.

Figure 2:
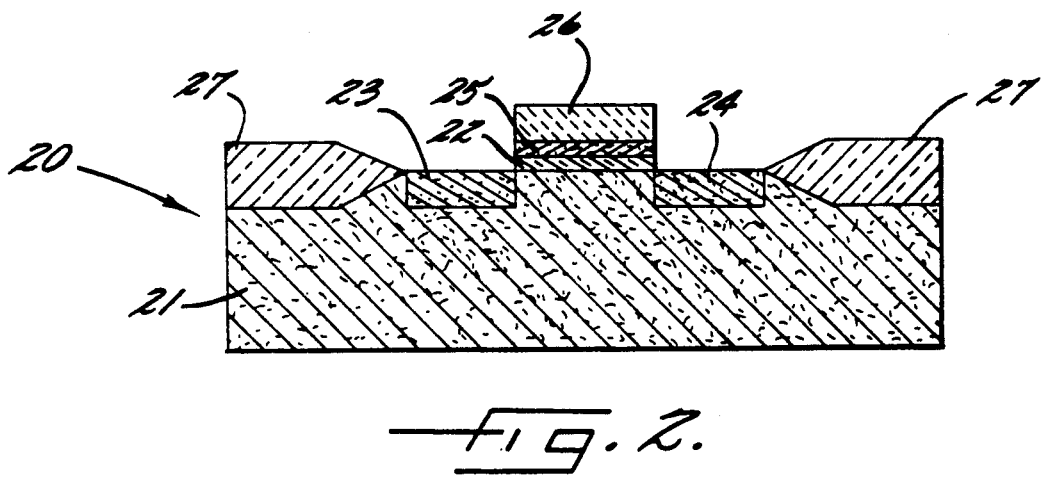
FIG. 2 is a cross-sectional view of a MOSFET precursor structure formed according to the present invention.

FIG. 2 illustrates a partially formed metal-oxide-semiconductor field effect transistor broadly designated at 20 that can be produced using the invention at relatively high through-put, with a minimal thermal budget, and using self-alignment techniques. The transistor 20 comprises a silicon substrate 21 that has a first conductivity type. A gate oxide portion 22 is positioned on the surface of the silicon substrate 21 and defines an active channel or gate in the substrate 21. A doped source 23 and a doped drain 24 are present in the substrate 21 and are respectively adjacent the gate oxide portion 22. The source 23 and the drain 24 have the opposite conductivity type from the silicon substrate 21 and thereby form respective p-n junctions with the gate. A thin film layer of polycrystalline silicon 25 is present on the gate oxide portion 22 and is thick enough to support the deposition of germanium thereon, and a germanium gate contact 26 that is formed of a germanium thin film is deposited upon the thin film layer of polycrystalline silicon. As described earlier, this layer is on the order of 10 nm or less in thickness with layers of 5 nm or less preferred.

Figure 3:
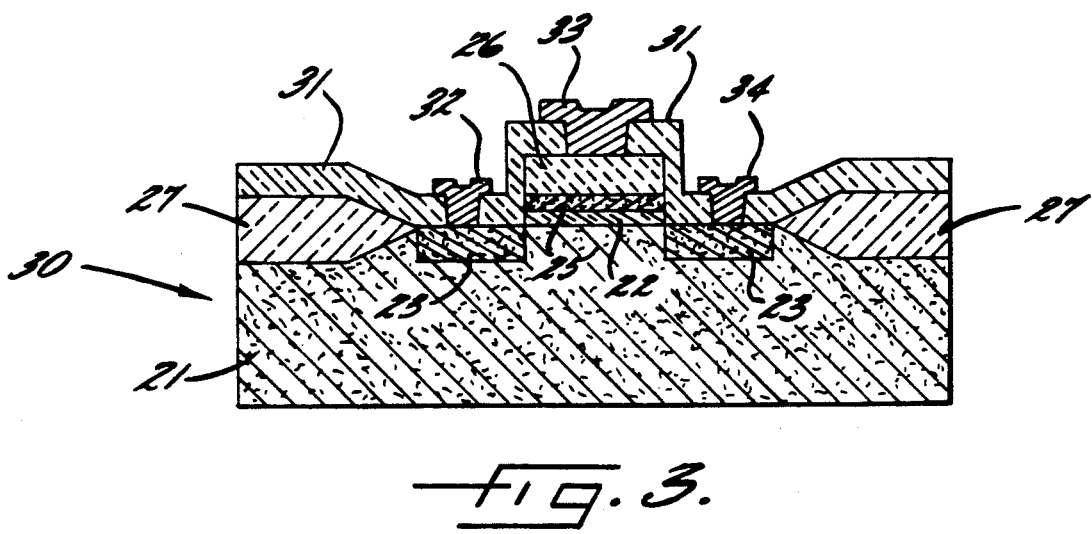
FIG. 3 is a cross sectional view of a substantially completed MOSFET according to the present invention.

FIG. 3 shows a more complete MOSFET 30 that includes some elements that are typical in addition to those illustrated in FIG. 2. These include the passivating layer 31 of silicon dioxide and respective metal contacts 32, 33, and 34 to the source 23, gate contact 26 and drain 24 respectively. In both FIG. 2 and FIG. 3, the MOSFET is electrically isolated as desired from other devices on the same wafer by portions of locally oxidized silicon 27.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A metal-oxide-semiconductor field effect transistor (MOSFET) that can be produced at relatively high throughput and with a minimal thermal budget and using self-alignment techniques; said transistor comprising:
    a silicon substrate having a first conductivity type;
    a silicon dioxide gate oxide portion on the surface of said silicon substrate, said gate oxide portion defining a gate in said silicon substrate;
    a doped source and a doped drain in said substrate and respectively adjacent said gate oxide portion and having the opposite conductivity type from said silicon substrate and forming respective p-n junctions with said gate;
    a thin film layer of polycrystalline silicon on said gate oxide portion and that is thick enough to support deposition of germanium thereon; and
    a germanium gate contact formed of a germanium thin film deposited upon said thin film layer of polycrystalline silicon.

2. A transistor according to claim 1 wherein said thin film layer of polycrystalline silicon is no more than about 10 nanometers thick.

3. A transistor according to claim 1 wherein said thin film layer of polycrystalline silicon is no more than about 5 nanometers thick.

4. A transistor according to claim 1 wherein said silicon substrate comprises a wafer and further comprising portions of locally-oxidized silicon on said wafer adjacent said transistor for isolating said transistor from other devices on said wafer.

5. A transistor according to claim 4 and further comprising an insulating passivating layer upon said source, said drain and said gate, and with said insulating layer having openings therein adjacent said source, said drain, and said gate, with metal contacts to said source, said drain, and in said germanium gate contact in said openings in said insulating layer.

6. A transistor according to claim 1 wherein said source and said drain are immediately adjacent said gate oxide and said gate oxide substantially defines said p-n junctions between said source and said gate and between said gate and said drain.

7. A gate structure for a metal-oxide-semiconductor field effect transistor comprising:
    a gate oxide portion on a semiconductor substrate for defining a gate in said semiconductor substrate;
    a thin film layer of polycrystalline silicon on said gate oxide portion and that is thick enough to support the deposition of germanium thereon; and
    a germanium gate contact formed of a germanium thin film deposited upon said thin film layer of polycrystalline silicon.

8. A gate structure according to claim 7 wherein said germanium thin film comprises polycrystalline germanium.

9. A gate structure according to claim 7 wherein said thin film layer of polycrystalline silicon is no more than about 10 nanometers thick.

10. A gate structure according to claim 7 wherein said thin film layer of polycrystalline silicon is no more than about 5 nanometers thick.

* * * * *